United States Patent [19]
Arai

[11] Patent Number: 5,896,028
[45] Date of Patent: Apr. 20, 1999

[54] NON-CONTACT TYPE SENSOR DRIVEN FROM A SINGLE POWER SUPPLY FOR ALLOWING A COMPACT CONFIGURATION AND REDUCED POWER CONSUMPTION

[75] Inventor: Yoichi Arai, Susono, Japan

[73] Assignee: Yazaki Coporation, Tokyo, Japan

[21] Appl. No.: 08/818,940

[22] Filed: Mar. 17, 1997

[30] Foreign Application Priority Data

Mar. 19, 1996 [JP] Japan ................... 8-063089

[51] Int. Cl.$^6$ ........................................ G01R 19/00
[52] U.S. Cl. ........................................ 324/117 H
[58] Field of Search ................. 324/117 R, 117 H, 324/251, 225, 130, 126, 127; 338/32 H; 327/511

[56] References Cited

U.S. PATENT DOCUMENTS

| | | | |
|---|---|---|---|
| 5,146,156 | 9/1992 | Marcel | 324/117 H |
| 5,654,630 | 8/1997 | Shimoyama et al. | 324/127 |

FOREIGN PATENT DOCUMENTS

4-24070  2/1992  Japan.

Primary Examiner—Vinh P. Nguyen
Attorney, Agent, or Firm—Oblon, Spivak, McClelland, Maier & Neustadt, P.C.

[57] ABSTRACT

An input sensor voltage is stepped up to a predetermined sensor voltage by a step-up single power supply circuit 30. The voltage thus stepped up is supplied to a first differential amplifier circuit 40, a first current buffer 50 and a constant voltage circuit 60. Either first or second transistor in the first current buffer 50 is turned on in accordance with a voltage difference across a Hall element 3 provided in a gap in a magnetic core of a coil 1. A current proportionate to a voltage from the first differential amplifier circuit 40 is output from the output terminal of the first current buffer 50 through a secondary winding 1c, a resistor RL and the constant voltage circuit 60 in the direction opposite to that of the current in a primary winding 1b to balance a magnetic flux in the coil 1. The constant voltage circuit 60 maintains a voltage at its output at a reference voltage.

4 Claims, 4 Drawing Sheets

NON-CONTACT TYPE SENSOR DRIVEN FROM A SINGLE POWER SUPPLY FOR ALLOWING A COMPACT CONFIGURATION AND REDUCED POWER CONSUMPTION

BACKGROUND OF THE INVENTION

1. Field of the Invention

The present invention relates to non-contact type sensors and, more particularly, to a non-contact type sensor driven by a single power supply for measuring a voltage or current on a non-contact basis.

2. Description of the Related Art

Non-contact type sensors in the art to which the invention is related include those operating on a single power supply to measure a current or voltage. Such a non-contact type sensor has an amplifier for amplifying an output voltage of a Hall element provided in the gap at a magnetic core of a secondary coil. First and second windings are wound around the secondary coil in opposite directions. A current in a direction opposite to that of the current to be measured is applied to the first winding. A current of the same ampere turns as that of a bias current to the first winding is applied to the second winding through a variable resistor to maintain magnetic flux in the magnetic core of the secondary coil at zero. Thus, a current is applied so that a bias current for a secondary current is canceled to achieve magnetic equilibrium of the secondary coil, thereby obtaining a voltage proportionate to the current to be measured.

Non-contact sensors of the related art include another type proposed by the applicant in an unpublished application. This non-contact type sensor employs driving from a single power supply of +12 V and has a configuration wherein a current in a negative direction flows from a current buffer to a secondary winding and resistor to cancel a magnetic flux generated by a current flowing through a primary winding and, when a current in the opposite direction flows through the primary winding, a current in a positive direction flows through the resistor, secondary winding and current buffer. In such a non-contact type sensor of the related art, a mid-point is provided for charging and discharging an output current, and the level of the mid-point is changed by turning the current buffer on and off. When a single power supply of +12 V is employed and first and second resistors connected to each other in series in a constant voltage circuit have the same resistance, the voltage dividing point between the first and second resistors has a voltage of +6 V. A voltage follower connected to the first and second resistors outputs the voltage of +6 V at the voltage dividing mid-point to an output terminal. A detection resistor provided at the output terminal for voltage measurement has a voltage on the side of the secondary winding which is about 0 V in the positive direction of the current and about 12 V in the positive direction of the current. Therefore, the voltage across the resistor provided at the output terminal for voltage measurement is ±6 V and, the range of voltage measurement is +6 V.

Further, in this non-contact type sensor of the related art, the resistance of the first resistor in the constant voltage circuit is varied. For example, if the resistance of the first voltage is set at one-half of the resistance of the second resistor when a single power supply of +12 V is employed, the voltage follower has an output of (⅔) V, i.e., +8 V because it outputs the voltage at the voltage dividing point between the first and second resistors.

Then, a negative or positive current flows from the current buffer to the secondary winding, detection resistor and voltage follower or from the voltage follower to the detection resistor, secondary winding and current buffer. At this time, the voltage of the detection resistor on the side of the secondary winding is about 0 V in the positive direction of the current and about 12 V in the positive direction of the current. That is, the voltage across the detection resistor is 8 V in the positive direction and 4 V in the negative direction, and the ratio between measuring ranges in the positive and negative directions is 2:1. Thus, the measuring ranges in the positive and negative directions can be varied by changing the resistance of the first resistor.

However, when a subbattery of +12 V is used, the method described above wherein the level of the mid-point is varied provides a measuring range of ±6 V which is not wide enough.

There are non-contact type sensors which include a DC—DC converter and use power supplies of +12 V and −12 V to be capable of providing a measuring range of ±12 V which is wide enough. This results in increases in power consumption, in the capacity of transformers and in the size of the non-contact type sensors themselves.

SUMMARY OF THE INVENTION

It is an object of the present invention to provide a non-contact type sensor capable of providing a wide measuring range.

It is another object of the present invention to provide a non-contact type sensor which employs driving from a single power supply to allow a compact configuration and reduced power consumption.

In order to achieve the above-described objects, a non-contact type sensor according to the present invention comprises: a Hall element provided in a gap in a magnetic core of a coil having a secondary winding for generating a voltage depending on a magnetic flux generated in the coil at an output terminal; a step-up single power supply circuit for stepping up a sensor voltage input thereto to a predetermined sensor voltage; a first differential amplifier circuit connected to the output terminal of the Hall element, the first differential amplifier circuit operating on an output of the step-up single power supply circuit for amplifying a voltage difference across the Hall element; a first current buffer connected to the output of the step-up single power supply circuit at one end and to ground at another end and having an output terminal connected to one end of the secondary winding, the first current buffer outputting a current proportionate to the voltage from the first differential amplifier circuit from the output terminal upon turning on of either first or second transistor thereof in response to the voltage from the first differential amplifier circuit; and a constant voltage circuit having an output connected to one end of a resistor which is connected to the secondary winding at the other end, the constant voltage circuit operating on an output of the step-up single power supply circuit for maintaining a voltage at the output at a reference voltage.

In the above-described configuration, when the step-up single power supply circuit steps up the input sensor voltage to the predetermined sensor voltage, the increased voltage is supplied to the first differential amplifier circuit, the first current buffer and the constant voltage circuit. When a magnetic flux is then generated in the coil, the Hall element generates a voltage depending on the magnetic flux at its output terminal.

Further, the voltage difference across the Hall element is amplified by the first differential amplifier circuit within the range of the increased voltage described above, and one of the transistors in the first current buffer is turned on in response to the voltage from the first differential amplifier circuit. The magnetic flux in the coil is balanced by causing a current proportionate to the voltage from the first differential amplifier to flow from the output terminal through the secondary winding, resistor and constant voltage circuit in the direction opposite to that of a current through a primary winding. Since the constant voltage circuit maintains the voltage at its output at the reference voltage, the voltage appearing across the resistor is within the range of the above-described increased voltage in accordance with the voltage from the first differential circuit.

Thus, the measuring range is not narrowed, and the driving from a single power supply allows a smaller configuration and reduced power consumption compared to a system wherein a DC—DC converter is used to produce two power supplies as in the prior art.

Meanwhile, the constant voltage circuit comprises:

a series circuit including first and second resistors connected in series, one of the resistors being connected to the step-up single power supply circuit, the other resistor being connected to the ground; a second differential amplifier circuit having an input terminal having one polarity to which the voltage from the Hall element is input from an input terminal having the other polarity of the first differential amplifier circuit, the second differential amplifier circuit amplifying a voltage difference between a voltage at a voltage dividing point of the series circuit and the voltage input from the Hall element; a second current buffer connected to the output of the step-up single power supply circuit at one end and to ground at another end and having an output terminal connected to the other end of the secondary winding, the second current buffer outputting a current proportionate to the voltage from the second differential amplifier circuit from the output terminal upon turning on of either third or fourth transistor thereof in response to the voltage from the second differential amplifier circuit; and a switching transistor turned on or off depending on the direction of a current flowing through the resistors for varying the voltage at the voltage dividing point of the series circuit. The voltage at the voltage dividing point of the series circuit varied by the switching transistor is input to the second differential amplifier circuit which in turn maintains its output at the voltage at the voltage dividing point.

In the above-described configuration, for example, when the first transistor is turned on by the output of the first differential amplifier circuit, for example, the fourth transistor is turned on by the output of the second differential amplifier circuit. Then, a current flows from the first transistor through the secondary winding, resistor to the fourth transistor.

When the second transistor is turned on by the output of the first differential amplifier circuit, the third transistor is turned on by the output of the second amplifier circuit. Then, a current flows from the third transistor through the resistor and secondary winding to the second transistor.

That is, a positive or negative current flows through the resistor. Then, the switching transistor is turned on or off depending on the direction of the current flowing through the resistor to vary the voltage at the voltage dividing point of the series circuit. The voltage at the voltage dividing point of the series circuit varied by the switching transistor is input to the second differential amplifier circuit which in turn maintains its output at the voltage at the voltage dividing point.

As a result, the measuring range can be varied depending on the direction of the current flowing through the resistor without varying the first and second resistors.

The step-up single power supply circuit is characterized in that it includes an integrated circuit for stepping up a sensor voltage input thereto to a predetermined sensor voltage.

The use of the integrated circuit as the step-up single power supply circuit allows a non-contact type sensor to be made compact.

Other objects and details of the present invention will become apparent from the accompanying drawings and the following detailed description of a preferred embodiment of the invention.

DETAILED DESCRIPTION OF PREFERRED EMBODIMENT

Figure 1:
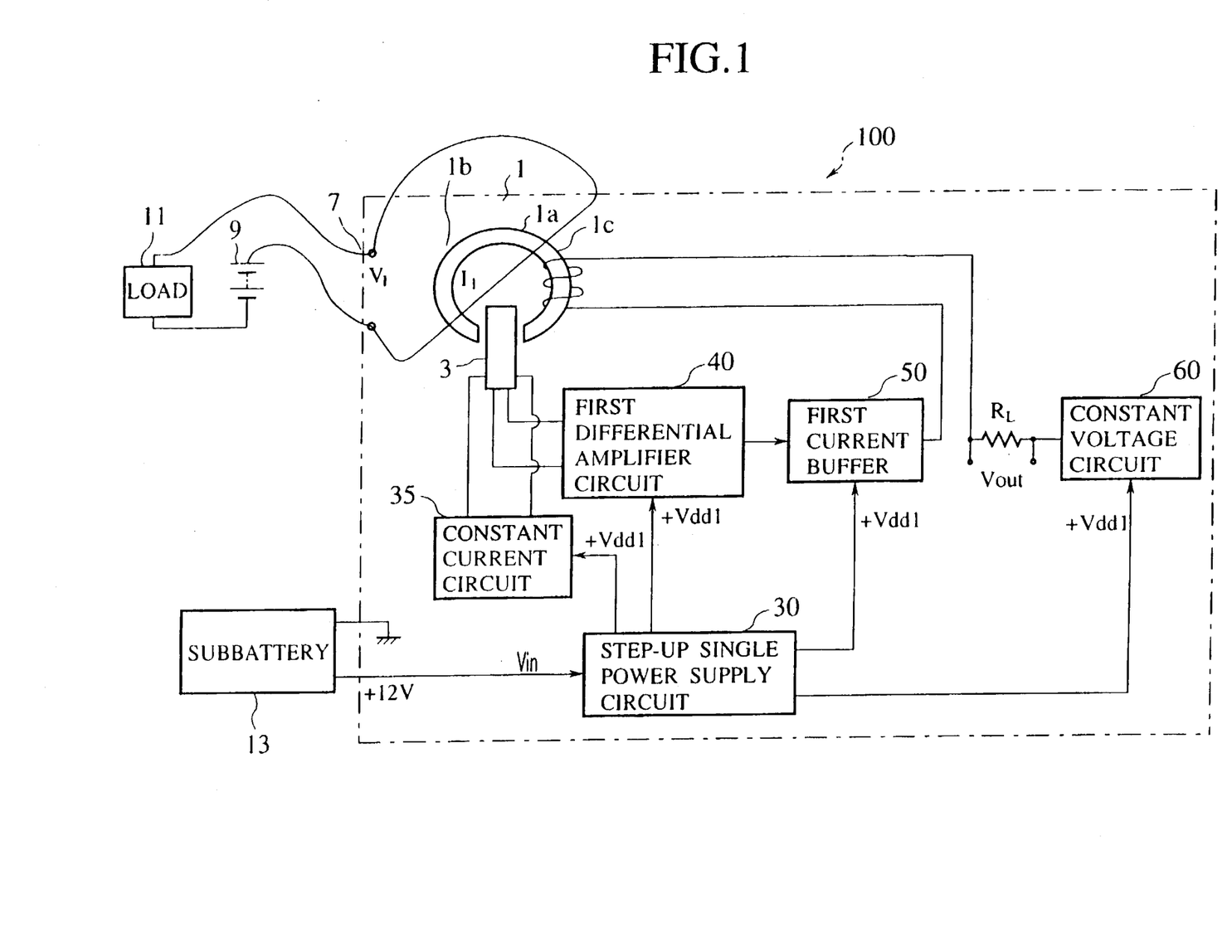
FIG. 1 illustrates a configuration of a non-contact type sensor according to an embodiment of the present invention.

A preferred embodiment of a non-contact type sensor according to the present invention will now be described. FIG. 1 shows a preferred embodiment of a non-contact type sensor 100.

The non-contact type sensor 100 in FIG. 1 is a voltage sensor which is driven by a single power supply for measuring voltages on a non-contact basis and which includes a coil 1, a Hall element 3, a step-up single power supply circuit 30, a constant current circuit 35, a first differential amplifier circuit 40, a first current buffer 50 and a constant voltage circuit 60.

One end of a primary winding 1b of the coil 1 is connected to an input terminal 7 which is connected to one end of a load 11. The other end of the load 11 is connected to one end of an external battery 9. The other end of the external battery 9 is connected to the other end of the primary winding 1b. The Hall element 3 is provided in a gap in a magnetic core 1a of the coil 1 having a secondary winding 1c and generates a voltage depending on a magnetic flux generated in the coil 1 at an output terminal through the step-up single power supply circuit 30, first differential amplifier circuit 40 and first current buffer 50.

The step-up single power supply circuit 30 steps up a sensor voltage Vin input from a subbattery 13 to a predetermined sensor voltage +Vdd1 and supplies the sensor voltage +Vdd1 which has been stepped up to the constant current circuit 35, first differential amplifier circuit 40, first current buffer 50 and constant voltage circuit 60. The constant current circuit 35 operates on the output voltage +Vdd1 supplied by the step-up single power supply circuit 30 to cause a constant current to flow through the Hall element 3.

The first differential amplifier circuit 40 is connected to the output terminal of the Hall element 3 and operates on the output voltage +Vdd1 supplied by the step-up single power supply circuit 30 to amplify a voltage difference across the Hall element 3 and output it to the first current buffer 50. The first current buffer 50 operates on the output voltage +Vdd1 supplied by the step-up single power supply circuit 30, has an output terminal connected to one end of the secondary winding 1c and outputs a current proportionate to the voltage from the first differential amplifier circuit 40 from the output terminal.

The constant voltage circuit 60 operates on the output voltage +Vdd1 supplied by the step-up single power supply circuit 30, has an output connected to one end of a resistor RL connected to the secondary winding 1c at the other end thereof and maintains a voltage at the output at a reference voltage.

Figure 2:
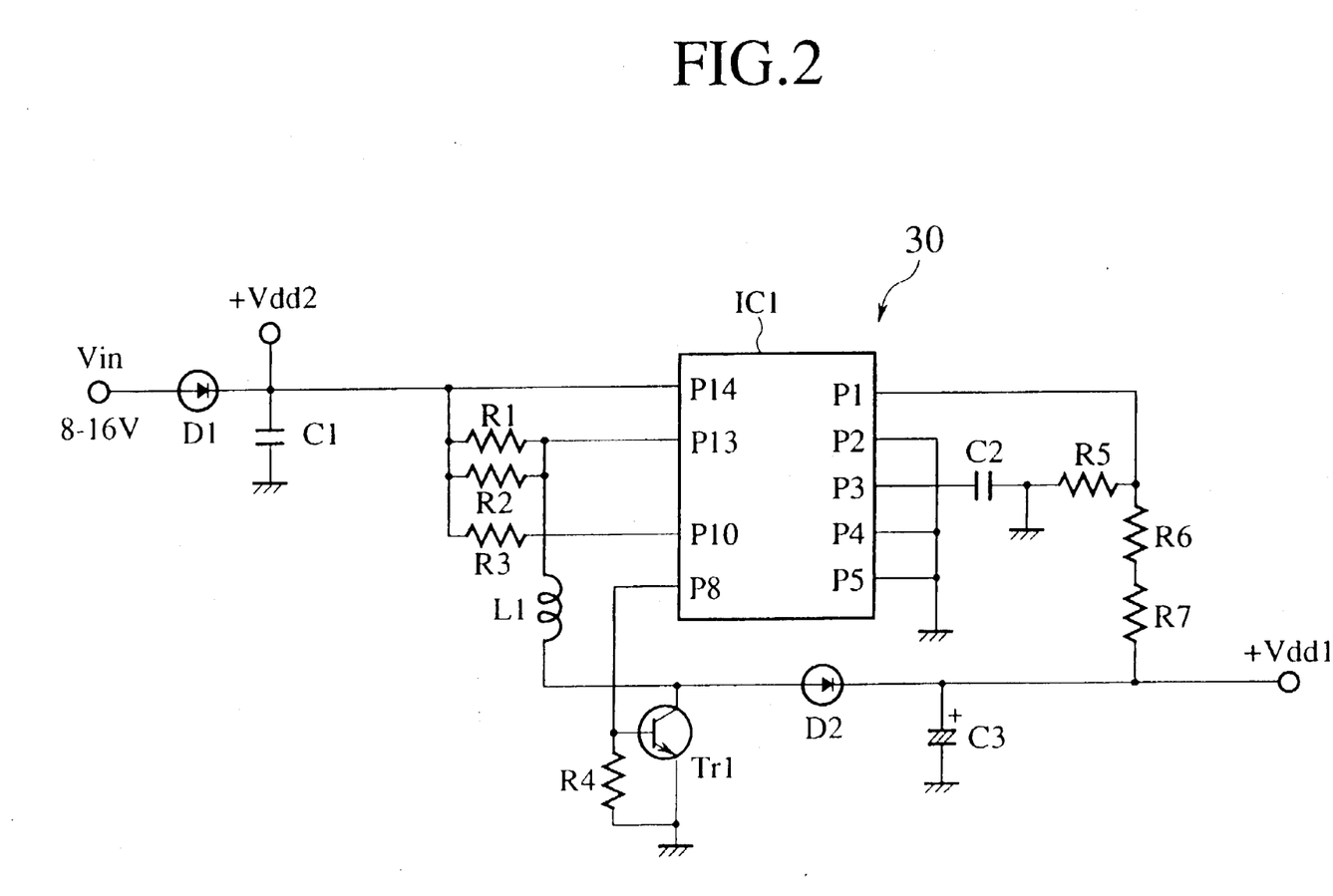
FIG. 2 illustrates a specific configuration of a step-up single power supply circuit of the embodiment of the invention.

FIG. 2 illustrates a specific circuit configuration of the step-up single power supply circuit 30. In the step-up single power supply circuit 30 shown in FIG. 2, the anode of a diode D1 is connected to the terminal for the sensor voltage Vin, and the cathode of the same is connected to one end of capacitor C1 and a terminal 14 of an IC 1 for a step-up power supply (IC P/N TL497 available form the firm T.I. in the United States). The other end of the capacitor C1 is connected to ground.

Parallel-connected resistors R1 and R2 are provided between the terminal P14 and a terminal P13 of the IC 1, and a resistor R3 is provided between the terminal P14 and a terminal P10 of the IC 1. One end of the coil L1 is connected to the terminal P13 of the IC 1, and a collector of a transistor Tr1 and the anode of a diode D2 are connected to the other end of the coil L1. A voltage Vdd2 is applied to the cathode of the diode D1, capacitor C1, terminal P14 of the IC 1 and resistors R1, R2 and R3.

The base of the transistor Tr1 and one end of a resistor R4 are connected to a terminal P8 of the IC 1, and the emitter of the transistor Tr1 and the other end of the resistor R4 are connected to the ground. One end of each of resistors R5 and R6 is connected to a terminal P1 of the IC 1, and one end of a capacitor C2 is connected to a terminal P3 of the IC 1. The other end of the resistor R5 and the other end of the capacitor C2 are connected to the ground, and terminals P2, P4 and P5 are also connected to the ground.

One end of a resistor R 7 is connected to the other end of the resistor R6, and the cathode of the diode D2 and one end of a capacitor C3 are connected to the other end of the resistor R7. The sensor voltage +Vdd1 which has been stepped up as described above is output from the other end of the resistor R7.

Figure 3:
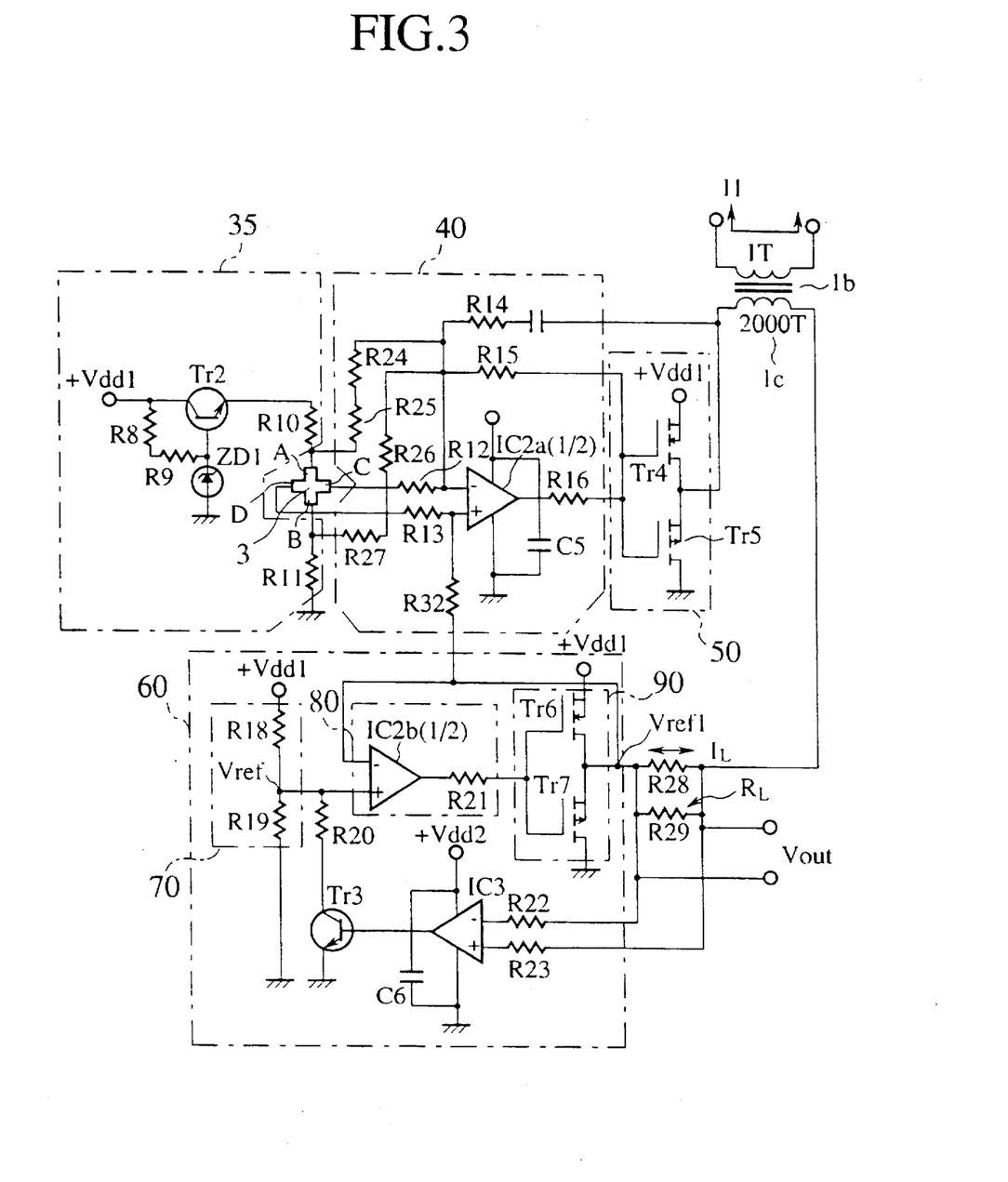
FIG. 3 illustrates a specific configuration of circuits on the embodiment of the invention excluding the step-up single power supply circuit.

FIG. 3 illustrates specific circuit configurations of the constant current circuit 35, first differential amplifier circuit 40, first current buffer 50 and constant voltage circuit 60.

In the constant current circuit 35 shown in FIG. 3, the sensor voltage +Vdd1 is connected to the collector of a transistor Tr2 and one end of a resistor R8 which is connected to one end of a resistor R9 at the other end thereof. The other end of the resistor R9 is connected to the base of the transistor Tr2 and the cathode of a Zener diode ZD1. The anode of the Zener diode ZD1 is connected to the ground, and the emitter of the transistor Tr2 is connected to one end of a resistor R10. An A-terminal of a Hall element 3 is connected to the other end of the resistor R10, and one end of a resistor R11 is connected to a B-terminal of the Hall element 3. The other end of the resistor 11 is connected to the ground.

In the first differential amplifier circuit 40 shown in FIG. 3, one end of a resistor R12 is connected to a C-terminal of the Hall element 3, and one end of a resistor R13 is connected to a D-terminal of the Hall element 3. The other end of the resistor R12 is connected to an inverting terminal (hereinafter referred to as "negative terminal") of an IC 2a constituted by a differential amplifier, and the other end of the resistor R13 is connected to a non-inverting terminal (hereinafter referred to as "positive terminal") of the IC 2a. The above-described sensor voltage +Vdd1 is supplied to the IC 2a, and a capacitor C5 is connected between the sensor voltage +Vdd1 and the ground.

One end of a resistor R25 is connected to the other end of the resistor R10, and one end of a resistor R24 is connected to the other end of the resistor R25. One end of a resistor R27 is connected to the resistor R11, and one end of a resistor R26 is connected to the other end of the resistor R27. The other end of the resistor R24 and the other end of the resistor R26 are connected to the negative terminal of the IC 2a.

One end of a resistor R16 is connected to an output terminal of the IC 2a, and a resistor R15 is connected between the other end of the resistor R16 and the negative terminal of the IC 2a. A resistor R14 and a capacitor C4 are connected in series to the negative terminal of the IC 2a. With the above-described configuration, the sensor voltage +Vdd1 id supplied to the IC 2a, and a voltage in accordance with the voltage difference across the Hall element 3 is output from the resistor R16.

Next, in the first current buffer 50, a push-pull circuit is configured by series-connecting a first field effect transistor Tr4 of the n-channel type (referred to as "first transistor") and a second field effect transistor Tr5 of the p-channel type (referred to as "second transistor"). The gates of the first transistor Tr4 and second transistor Tr5 are connected to the other end of the resistor R16.

The sensor voltage +Vdd1 is supplied to the drain of the first transistor Tr4, and the drain of the second transistor Tr5 is connected to the ground. The sources of the first transistor Tr4 and second transistor Tr5 are connected to the ground, and the mid-point at which the connection is made is connected to one end of the secondary winding 1c (2000 T) as an output terminal. The primary winding 1b is of 1T through which a current to be measured flows.

Either the first transistor Tr4 or second transistor Tr5 is turned on in accordance with a differential amplification output from the resistor R16 to perform current amplification, and the amplified current is output from the mid-point to the secondary winding 1c.

The other end of the capacitor C4 is connected to one end of the secondary winding 1c, and one end of each of parallel-connected detection resistors R28 and R29 is connected to the other end of the primary winding 1c. The combined resistance of the parallel-connected detection resistors R28 and R29 corresponds to the resistor RL shown in FIG. 1, and a sensor output voltage VOUT is obtained from a sensor output current IL flowing through the resistor RL and the resistance RL.

Next, in the constant voltage circuit 60, one end of a resistor R32 is connected to the positive terminal of the IC 2a, and the other end of the resistor R32 is connected to a negative terminal of an IC 2b and the other terminal of each of the resistors R28 and R29. The sensor voltage +Vdd1 is supplied to one end of a resistor R18, and the other end of the resistor R18 is connected to one end of a resistor R19 which is connected to the grounded at the other end thereof. A series circuit 70 is formed by the resistors R18 and R19.

A positive terminal of the IC 2b and one end of a resistor R20 are connected to one end of the resistor R19, and one end of a resistor R21 is connected to an output terminal of the IC 2b. A second differential amplifier circuit 80 is formed by the IC 2b and the resistor R21. A push-pull circuit is configured by series-connecting a third field effect transistor Tr6 of the n-channel type (referred to as "third transistor") and a fourth field effect transistor Tr7 of the p-channel type (referred to as "fourth transistor"). The gates of the third transistor Tr6 and fourth transistor Tr7 are connected to the other end of the resistor R21. A second current buffer 90 is formed by the third transistor Tr6 and the fourth transistor Tr7.

The sensor voltage +Vdd1 is supplied to the drain of the third transistor Tr6, and the drain of the fourth transistor Tr7 is connected to the ground. The sources of the third transistor Tr6 and fourth transistor Tr7 are connected to the ground, and the mid-point at which the connection is made is connected to the other end of each of the resistors R28 and R29 as an output terminal.

Either the third transistor Tr6 or fourth transistor Tr7 operates in accordance with a differential amplification output from the resistor R21 to perform current amplification, and the amplified current is output from the mid-point.

A resistor R23 is connected between one end of the resistor R29 and a positive terminal of an IC 3 constituted by a differential amplifier, and a resistor R22 is connected between the other end of the resistor R29 and a negative terminal of the IC 3 constituted by a differential amplifier. A voltage +Vdd2 is supplied to the IC 3, and a capacitor C6 is connected between the voltage +Vdd2 and the ground. The base of a transistor Tr3 as a switching transistor is connected to an output terminal of the IC 3. The collector of the transistor Tr3 is connected to the other end of the resistor R20, and the emitter of the transistor Tr3 is connected to the ground.

Next, a description will now be made on the operation of an embodiment of a non-contact type sensor having the configuration as described above. First, in the step-up single power supply circuit 30, when a sensor voltage of, for example, +12 V from the subbattery 13 is applied to the terminal P14 of the integrated circuit IC 1 through the diode D1 shown in FIG. 2, a voltage is applied from the terminal P8 of the integrated circuit IC 1 to the base of the transistor Tr1 to cause the transistor Tr1 to operate. The output of the transistor Tr1 is output to the resistor R7 through the diode D2.

A voltage from the terminal P1 of the integrated circuit IC 1 is output through the resistor R6 to the resistor R7 to provide the sensor voltage +Vdd1 which has been stepped up. As the sensor voltage +Vdd1, for example, +15 V is output.

Next, the sensor voltage +Vdd1 from the step-up single power supply circuit 30 is applied to the constant current circuit 35, first differential amplifier circuit 40, first current buffer 50 and constant voltage circuit 60 to perform driving from a single power source. In the constant current circuit 35 shown in FIG. 3, the Zener diode ZD1 is broken down when the sensor voltage +Vdd1 is supplied to the collector of the transistor Tr2 and a predetermined voltage is applied to the base through the resistors R8 and R9. Then, a predetermined emitter current flows from the emitter of the transistor Tr2 through the A-terminal and B-terminal of the Hall element 3 to the resistor R11 to cause the Hall element 3 to operate.

Meanwhile, a discharge current is supplied from the battery 9 as the load fluctuates. This discharge current is output also to the voltage sensor to be output to the primary winding 1b of the coil 1. As a result, a magnetic flux Φ 1 is generated also in the magnetic core of the coil 1. At this time, a voltage corresponding to the magnetic flux Φ 1 is obtained at the C- and D-terminals of the Hall element 3, and this voltage is input through the resistors R12 and R13 to the IC 2a in the first differential amplifier circuit 40. The input voltage is amplified by the IC 2a within the range from 0 V to +Vdd1 and is input to the first current buffer 50 through the resistor R16.

A description will now be made on measurement of a current to be measured I in a positive direction. Specifically, let us assume that the potential at the C-terminal of the Hall element 3 is higher (positive) than the potential at the D-terminal in accordance with the current to be measured I in a positive direction. Then, the first transistor Tr4 in the first current buffer 50 operates in response to the output of the IC 2a. Further, the output at the positive terminal of the IC 2a is input to the negative terminal of the IC 2b through the resistor R32. Therefore, the output of the IC 2b causes the fourth transistor Tr7 to operate.

Then, an output current IL flows through the first transistor Tr4, secondary winding 1c, detection resistor RL, fourth transistor Tr7 and ground to produce a magnetic flux Φ 2 which cancels the magnetic flux Φ 1 at the secondary winding 1c of the coil 1. The output current IL flows also to the negative terminal of the IC 2b through the detection resistor RL. That is, since a magnetic flux is generated in a direction opposite to that of the magnetic flux Φ 1 produced by a current II flowing through the primary winding, magnetic equilibrium is always maintained in the coil 1.

Let us assume now that the sensor power supply voltage which has been stepped up is +15 V; Vcel represents a voltage drop in the transistors; Rcl represents the resistance of the secondary winding; and RL represents detection resistance. Then, the measuring range is expressed by:

$$15 \geq Vcel + (Rcl+RL) \times IL$$

That is, since a wider sensor power supply voltage allows a wider measuring range, the present embodiment prevents a measuring range from being narrowed.

Further, since the positive voltage applied to one end of the detection resistor RL is applied through the resistor R23 to the positive terminal of the IC 3 and the negative voltage applied to the other end of the detection resistor RL is applied through the resistor R22 to the negative terminal of the IC 3, the transistor Tr3 is turned on by the output of the IC 3.

As a result, a voltage Vref at the mid-point is shifted toward zero voltage. Next, the voltage Vref shifted toward zero voltage at the mid-point is input to the IC 2b which maintains its output at the voltage Vref.

Therefore, the range of voltage measurement can be kept wider than a fixed range obtained by dividing the voltage Vref by the resistors R18 and R19. For example, the voltage at the voltage dividing point between the resistors R18 and R19 is about 3 V if the sensor voltage +Vdd1 is +15 V; the resistors R18 and R19 have the same resistance; and the resistance of the resistor R20 is about one-third the resistance of the resistor R19.

A description will now be made on measurement of a current to be measured I in a negative direction. Specifically, let us assume that the potential at the C-terminal of the Hall element 3 is lower (negative) than the potential at the D-terminal in accordance with the current to be measured I in a negative direction. Then, the second transistor Tr5 in the first current buffer 50 operates in response to the output of the IC 2a. Further, the output at the positive terminal of the IC 2a is input to the negative terminal of the IC 2b through the resistor R32. Therefore, the output of the IC 2b causes the third transistor Tr6 to operate.

Then, an output current IL flows through the third transistor Tr6, detection resistor RL, secondary winding 1c, second transistor Tr5 and ground to produce a magnetic flux Φ 2 which cancels the magnetic flux Φ 1 at the secondary winding 1c of the coil 1. Further, the output current IL flows from the negative terminal of the IC 2b to the detection resistor RL. That is, since a magnetic flux is generated in a direction opposite to that of the magnetic flux Φ 1 produced by a current II flowing through the primary winding, magnetic equilibrium is always maintained in the coil 1.

Further, since the negative voltage applied to one end of the detection resistor RL is applied through the resistor R23 to the positive terminal of the IC 3 and the positive voltage applied to the other end of the detection resistor RL is applied through the resistor R22 to the negative terminal of the IC 3, the transistor Tr3 is turned off. At this time, the voltage Vref at the mid-point is shifted toward a voltage Vdd1. Next, the voltage Vref shifted toward the voltage Vdd1 at the mid-point is input to the IC 2b which maintains its output at the voltage Vref.

For example, the voltage at the voltage dividing point between the resistors R18 and R19 is about 7.5 V if the sensor voltage +Vdd1 is +15 V and the resistors R18 and R19 have the same resistance.

Thus, only the positive power supply is stepped up using the step-up single power supply circuit 30 including IC's for driving from a single power supply in the voltage sensor. According to the present embodiment, it is therefore possible to make a power supply portion compact and to reduce power consumption because there is no need for two power supplies, i.e., positive and negative power supplies and transformers unlike the prior art.

Further, a voltage input to the sensor is stepped up to a predetermined sensor voltage by the step-up single power supply circuit, and the sensor voltage which has been stepped up is supplied to each part of the sensor. This expands the range of the power supply voltage and consequently allows a wider measuring range.

Furthermore, since the transistor Tr3 is operated depending on whether the current in the detection resistor RL flows in a positive or negative direction, the measuring range can be varied without varying the resistor R18. In this case, when a current flows from the detection resistor RL to the fourth transistor Tr7, the measuring range is greatly expanded while when a current flows from the third transistor Tr6 to the detection resistor RL, the measuring range stays in a normal range.

Figure 4:
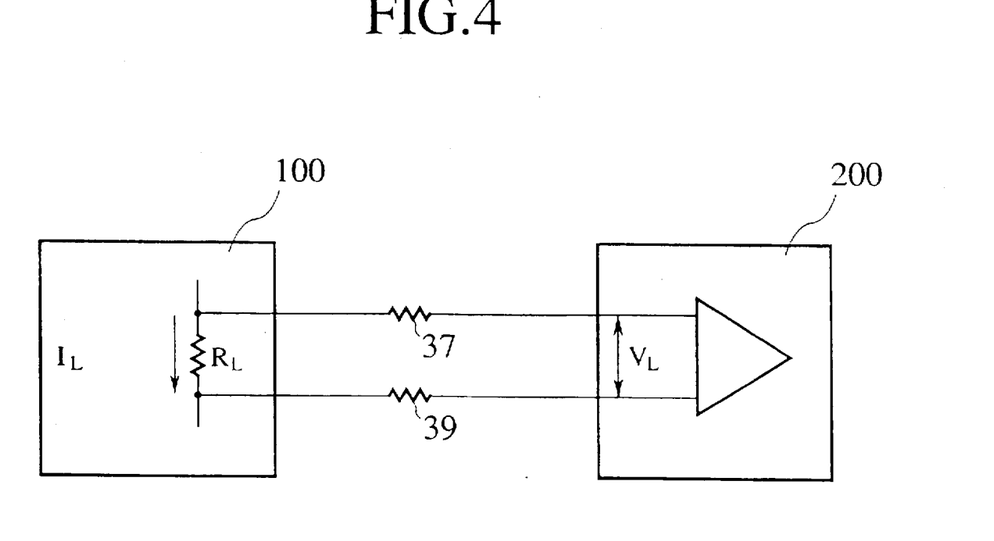
FIG. 4 illustrates detection resistors provided at the sensor side.

In another embodiment of the present invention, as shown in FIG. 4, the detection resistor RL is incorporated in the non-contact type sensor 100 and a detection voltage VL is obtained at a user-side device 200 through parasitic resistors 37 and 39.

Figure 5:
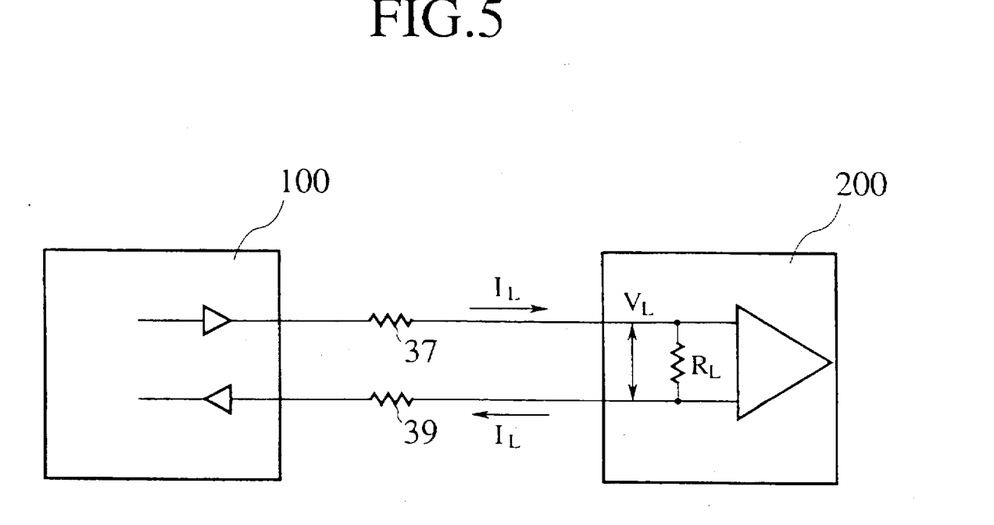
FIG. 5 illustrates detection resistors provided at the user side.

If various factors such as anti-noise characteristics and internal resistance of the output line, the detection resistor RL may be provided at the user-side to obtain the detection voltage VL from the current IL that flows from the sensor through the parasitic resistors 37 and 39.

It is apparent that various embodiments may be configured without departing from the spirit and scope of the present invention. Therefore, the present invention is not limited to the specific embodiments disclosed except those limited by the appended claims.

What is claimed is:

1. A non-contact type sensor comprising:
   a Hall element provided in a gap in a magnetic core of a coil having a secondary winding for generating a voltage depending on a magnetic flux generated in said coil at an output terminal;
   a step-up single power supply circuit for stepping up a sensor voltage input thereto to a predetermined sensor voltage;
   a first differential amplifier circuit connected to the output terminal of said Hall element, said first differential amplifier circuit operating on an output of said step-up single power supply circuit for amplifying a voltage difference across said Hall element;
   a first current buffer connected to the output of said step-up single power supply circuit at one end and to ground at another end and having an output terminal connected to one end of said secondary winding, said first current buffer outputting a current proportionate to the voltage from said first differential amplifier circuit through said output terminal upon turning on of either first or second transistor thereof in response to the voltage from said first differential amplifier circuit; and
   a constant voltage circuit having an output connected to one end of a resistor which is connected to said secondary winding at the other end, said constant voltage circuit operating on an output of said step-up single power supply circuit for maintaining a voltage at said output at a reference voltage.

2. The non-contact type sensor according to claim 1, wherein said constant voltage circuit comprises:
   a series circuit including first and second resistors connected in series, one of said resistors being connected to said step-up single power supply circuit, the other resistor being connected to the ground;
   a second differential amplifier circuit having an input terminal having one polarity to which the voltage from said Hall element is input from an input terminal having the other polarity of said first differential amplifier circuit, said second differential amplifier circuit amplifying a voltage difference between a voltage at a voltage dividing point of the series circuit and the voltage input from said Hall element;
   a second current buffer connected to the output of said step-up single power supply circuit at one end and to ground at another end and having an output terminal connected to the other end of said secondary winding, said second current buffer outputting a current proportionate to the voltage from said second differential amplifier circuit through said output terminal upon turning on of either third or fourth transistor thereof in response to the voltage from said second differential amplifier circuit; and
   a switching transistor turned on or off depending on the direction of a current flowing through said resistors for varying the voltage at the voltage dividing point of said series circuit, and wherein:
   the voltage at the voltage dividing point of said series circuit varied by said switching transistor is input to said second differential amplifier circuit which maintains its output at the voltage at the voltage dividing point.

3. The non-contact type sensor according to claim 1, wherein said step-up single power supply circuit comprises an integrated circuit for stepping up a sensor voltage input thereto to a predetermined sensor voltage.

4. The non-contact type sensor according to claim 2, wherein said step-up single power supply circuit comprises an integrated circuit for stepping up a sensor voltage input thereto to a predetermined sensor voltage.

* * * * *

UNITED STATES PATENT AND TRADEMARK OFFICE
CERTIFICATE OF CORRECTION

PATENT NO. : 5,896,028
DATED : APRIL 20, 1999
INVENTOR(S): Yoichi ARAI

It is certified that an error appears in the above-identified patent and that said Letters Patent is hereby corrected as shown below:

In Column 1, line 53, change "positive" to --negative--.

In Column 2, line 5, change "positive" to --negative--.

In Column 5, line 19, change "form" to --from--.

In Column 6, line 62, change "grounded" to --ground--.

Signed and Sealed this

Thirtieth Day of January, 2001

Attest:

Q. TODD DICKINSON

Attesting Officer

Director of Patents and Trademarks